US007039127B2

(12) United States Patent
Kato

(10) Patent No.: US 7,039,127 B2
(45) Date of Patent: May 2, 2006

(54) DIGITAL BROADCAST RECEIVING APPARATUS

(75) Inventor: Sei Kato, Kawagoe (JP)

(73) Assignee: Pioneer Corporation, Tokyo (JP)

( * ) Notice: Subject to any disclaimer, the term of this patent is extended or adjusted under 35 U.S.C. 154(b) by 868 days.

(21) Appl. No.: 09/901,563

(22) Filed: Jul. 11, 2001

(65) Prior Publication Data

US 2002/0021768 A1 Feb. 21, 2002

(30) Foreign Application Priority Data

Jul. 11, 2000 (JP) ............................ 2000-209744

(51) Int. Cl.
*H03K 9/00* (2006.01)
*H04L 27/06* (2006.01)

(52) U.S. Cl. .................................................... 375/316

(58) Field of Classification Search ................ 375/225, 375/349, 324
See application file for complete search history.

(56) References Cited

U.S. PATENT DOCUMENTS

| | | | | |
|---|---|---|---|---|
| 5,483,690 | A | 1/1996 | Schroder et al. | |
| 5,991,622 | A * | 11/1999 | Henry, Jr. | 455/434 |
| 6,272,343 | B1 * | 8/2001 | Pon et al. | 455/434 |
| 6,434,138 | B1 * | 8/2002 | Kersken et al. | 370/349 |
| 6,865,379 | B1 * | 3/2005 | Liebenow | 455/161.3 |

FOREIGN PATENT DOCUMENTS

| | | |
|---|---|---|
| EP | 0 961 432 A | 12/1999 |
| WO | WO 99/14874 A | 3/1999 |

* cited by examiner

*Primary Examiner*—Kevin Kim
(74) *Attorney, Agent, or Firm*—Sughrue Mion, PLLC

(57) ABSTRACT

A receivable service is selected from each ensemble of a digital broadcast, and the error rate of the selected service is measured. Only a service belonging to an ensemble containing a service which satisfies a predetermined reference value is searched and preset. A service belonging to an ensemble containing a service with a low error rate is searched and preset, with priority over a service belonging to an ensemble containing a service with a high error rate. The reception level of a receivable service may be used instead of the error rate as the selection reference for processing.

4 Claims, 5 Drawing Sheets

(NOTE)
(A) INDICATES RECEPTION LEVEL STORED AT ADDRESS A IN MEMORY

DIGITAL BROADCAST RECEIVING APPARATUS

BACKGROUND OF THE INVENTION

1. Field of the Invention

The present invention relates to a digital broadcast receiving apparatus in which a receiver for receiving digital broadcasts consisting a plurality of ensembles, with each ensemble including a plurality of services, performs at least one of search processing and preset processing for a receivable service.

2. Description of the Related Art

In the case of an on-vehicle broadcast receiver, the reception conditions of receivable broadcast stations and radio waves always vary according to the movement of the vehicle. Therefore, search processing (hereinafter called search) and auto-preset processing (hereinafter called preset) are widely reception.

In the present specifications, the term “search” means the retrieval of receivable programs. That is, the term “search” means a procedure in which, first, all the programs are retrieved, and when a receivable program that can be received under good conditions is detected, such retrieval is terminated and the reception of such program starts. The user can selectively retrieve a program which can be received under good conditions out of a plurality of programs by repeating such search.

The term “preset” means the retrieval and storage of receivable programs. That is, the term “preset” means a procedure in which the reception of all the programs is preliminarily retrieved, and such programs are allocated to a plurality of preset buttons according to the reception conditions.

However, in the case of conventional search and preset, it is necessary to receive programs one by one and to check their reception conditions. Therefore, if there are many programs to be received, it takes a long time to perform the above-mentioned procedure.

Especially, compared with conventional analog broadcasts, digital broadcasts now under diffusion include a vast number of programs, so it takes a very long time for search and preset.

OBJECTS AND SUMMARY OF THE INVENTION

It is the object of the present invention to overcome the problems associated with such situation. That is, the object of the present invention is to provide a digital broadcast receiving apparatus which can perform the search and the preset of receivable programs in a short time.

In a receiver for receiving digital broadcasts consisting of a plurality of ensembles, with one ensemble including a plurality of services, a digital broadcast receiving apparatus according to the present invention, which performs at least one of search and preset for a receivable service, comprises: an error rate detecting part for detecting the error rate of the reception of said service; and an error rate comparing part for comparing the value detected by said error rate detecting part with a predetermined reference value; characterized by performing at least one of said search and said preset for a service belonging to an ensemble containing a service with a low error rate which satisfies said predetermined reference value based on said compared results by said error rate comparing part.

DETAILED DESCRIPTION OF THE PREFERRED EMBODIMENT

Figure 1:
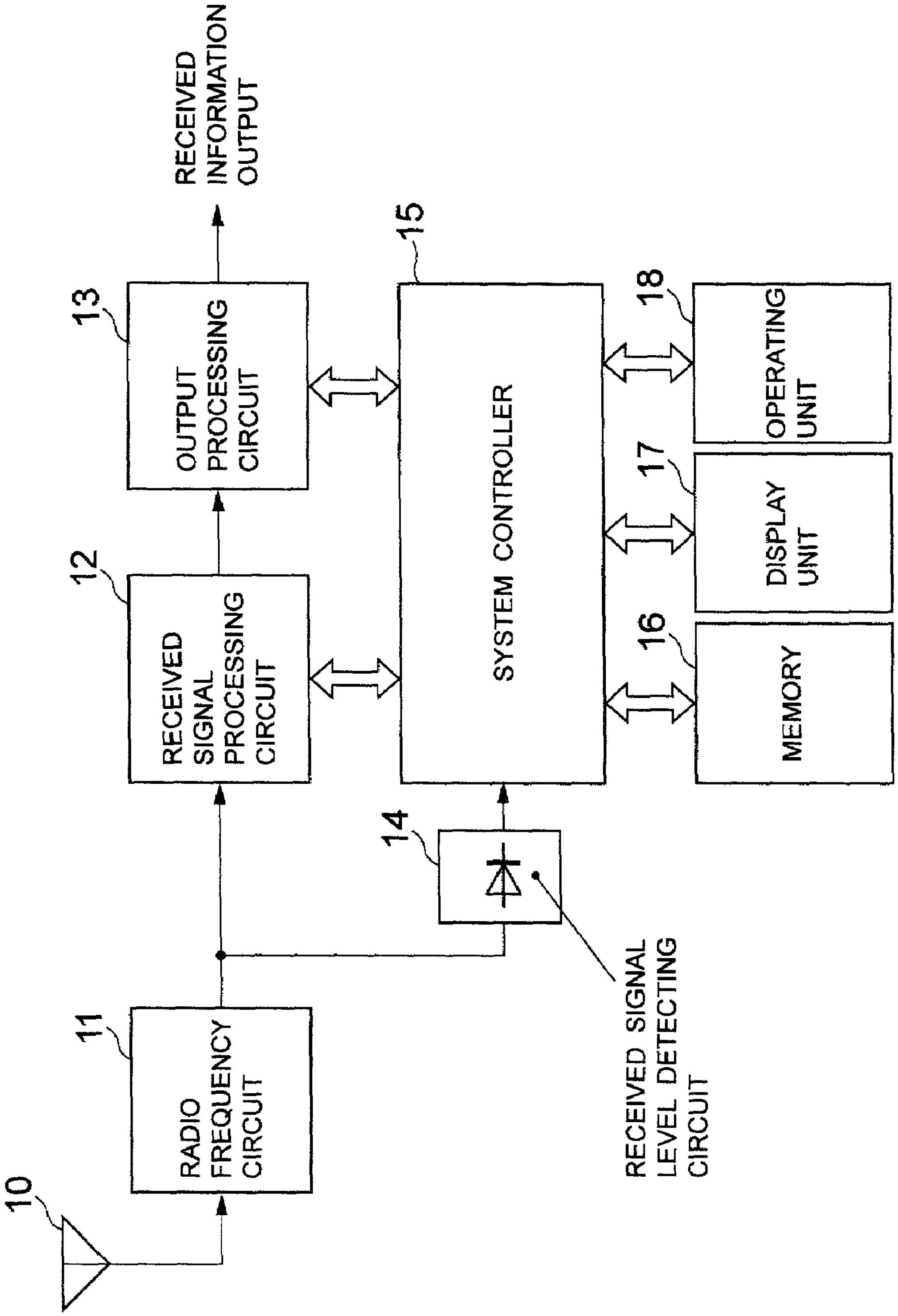
FIG. 1 is a block diagram of the configuration of a digital broadcast receiving apparatus according to the present invention.

FIG. 1 is a block diagram of the configuration of an on-vehicle digital broadcast receiving apparatus according to the present invention.

In FIG. 1, a small reception antenna 10 such as a rod antenna and a plane antenna which receive radio waves from a broadcast station. A radio frequency circuit 11 is a circuit in a receiver for performing front-end processing such as amplification and frequency conversion of the radio frequency signal received by the antenna 10.

A received signal processing circuit 12 detects and demodulates the received signals converted into intermediate frequency signals by the radio frequency circuit 11. The received signal processing circuit 12 has a function to demodulate digital data from the received signals. The received signal processing circuit 12 also performs a series of processings such as de-interleave processing (processing for rearranging data in time series in the receiving apparatus for reducing the error rate in the transmission path) of the demodulated digital data, error correction processing, and error rate detection processing. These processings are necessary for reproducing received information accurately.

An output processing circuit 13 is a circuit for converting the received information reproduced in the received signal processing circuit 12 into information formats suitable for output terminal equipment (not shown) for voice, image, text, etc., in order to output such results.

A received signal level detecting circuit 14 is a circuit for detecting the received level of signals in a plurality of frequency bands converted into predetermined intermediate frequencies in the radio frequency circuit 11 and sending the detected value to a system controller 15.

The system controller 15 mainly comprises a microcomputer, which controls the operation of the entire receiving apparatus according to the present invention. The function of the system controller 15 is to execute a main program and various subprograms stored in a memory 16 in synchronization with an internal clock.

The memory 16 comprises memory elements such as a ROM (Read Only Memory) and a RAM (Random Access Memory). The ROM stores various kinds of programs for controlling the operation of the receiving apparatus. The RAM stores various kinds of processed values in the course of the processing operations of the receiving apparatus.

A display unit 17 and an operating unit 18 are mounted on a console panel to be operated by the user. The display unit 17 comprises a display such as liquid crystal, EL (electro luminescence), or light emitting diode, for displaying the status of the apparatus and reception condition. The operating unit 18 comprises a keyboard and switch groups for inputting various instructions for the apparatus.

The digital broadcast in the embodiment comprises two ensembles A and B. Each ensemble is a digital broadcast system consisting of 10 services.

The term "service" means the offer of various kinds of information such as voice, image, text, and programs to be transmitted from a broadcast station to the viewer/listener of the digital broadcast. That is, the term "service" is a concept similar to the programs or channels of conventional analog broadcasts.

The term "ensemble" means a group consisting of a plurality of factors. For example, when a group of digital data as one group contains the digital data of a plurality of services, all of such a digital data group is called an ensemble. In the embodiment, all of a group of frequency band signals containing a plurality of such services is called an ensemble.

In digital broadcasts, each service is multiplexed in the frequency band of the ensemble to which it belongs. As the multiplex system, for example, a multicarrier system such as code division multiplex and orthogonal frequency division multiplex is used. Therefore, unlike the case of time division multiplex and conventional frequency division multiplex, the problems caused when the reception conditions of each multiplexed signal differs from each other depending on the position of the multiplexed timeslots and the position of frequency allocation do not arise. That is, in a digital broadcast, it is ensured that the plurality of services contained in the same ensemble can be received under the same reception conditions without exception.

The preset operation performed by the present apparatus is described below. Preset operation means the retrieval of a receivable service and the allocation of the service to a preset button. The processing in operation mode 1 is described first. Operation mode 1 means the operation performed when preset is performed based on the error rate of a receivable service.

Figure 2:
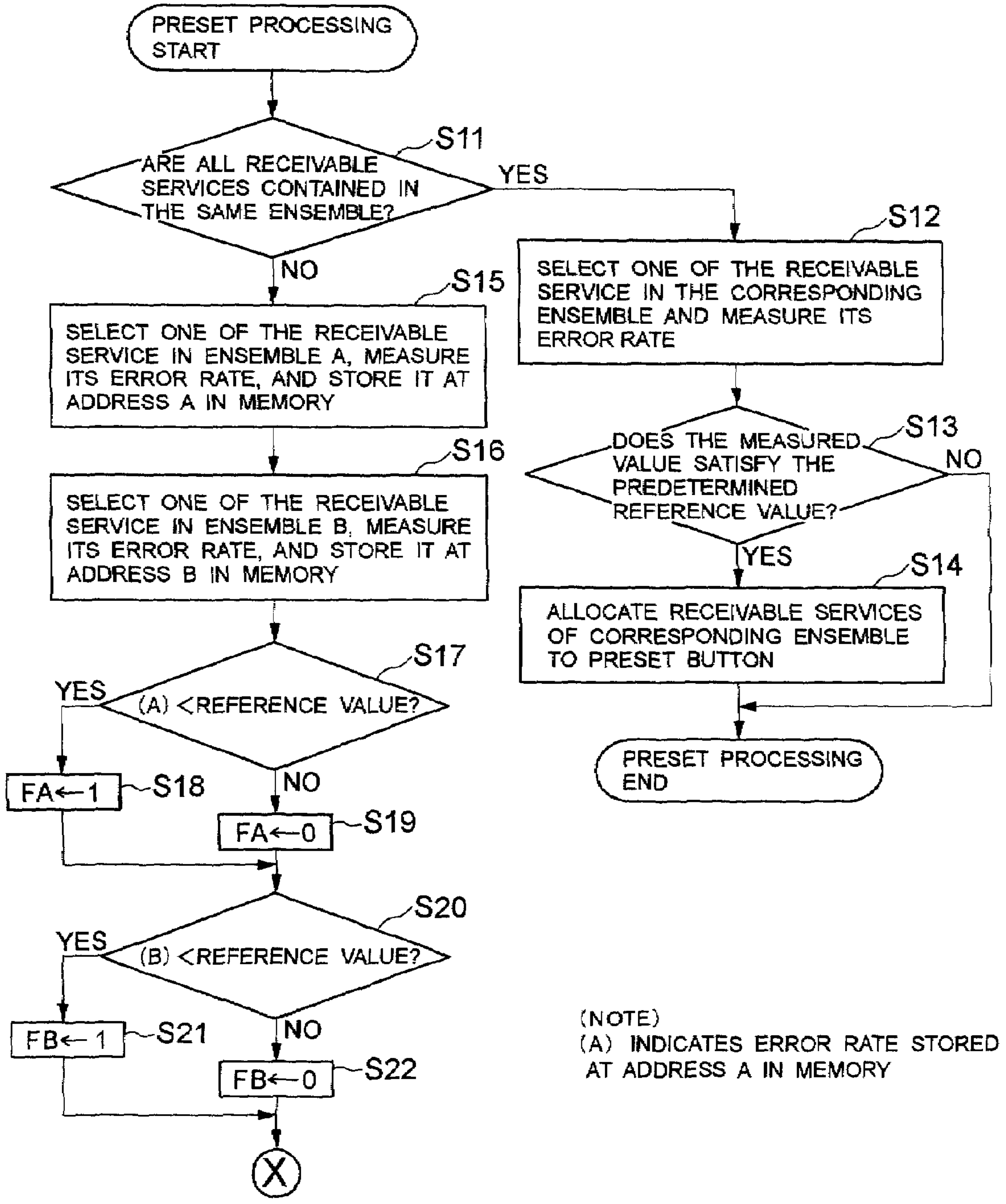
FIG. 2 is a flowchart of the processing in operation mode 1 of the apparatus in FIG. 1.
Figure 3:
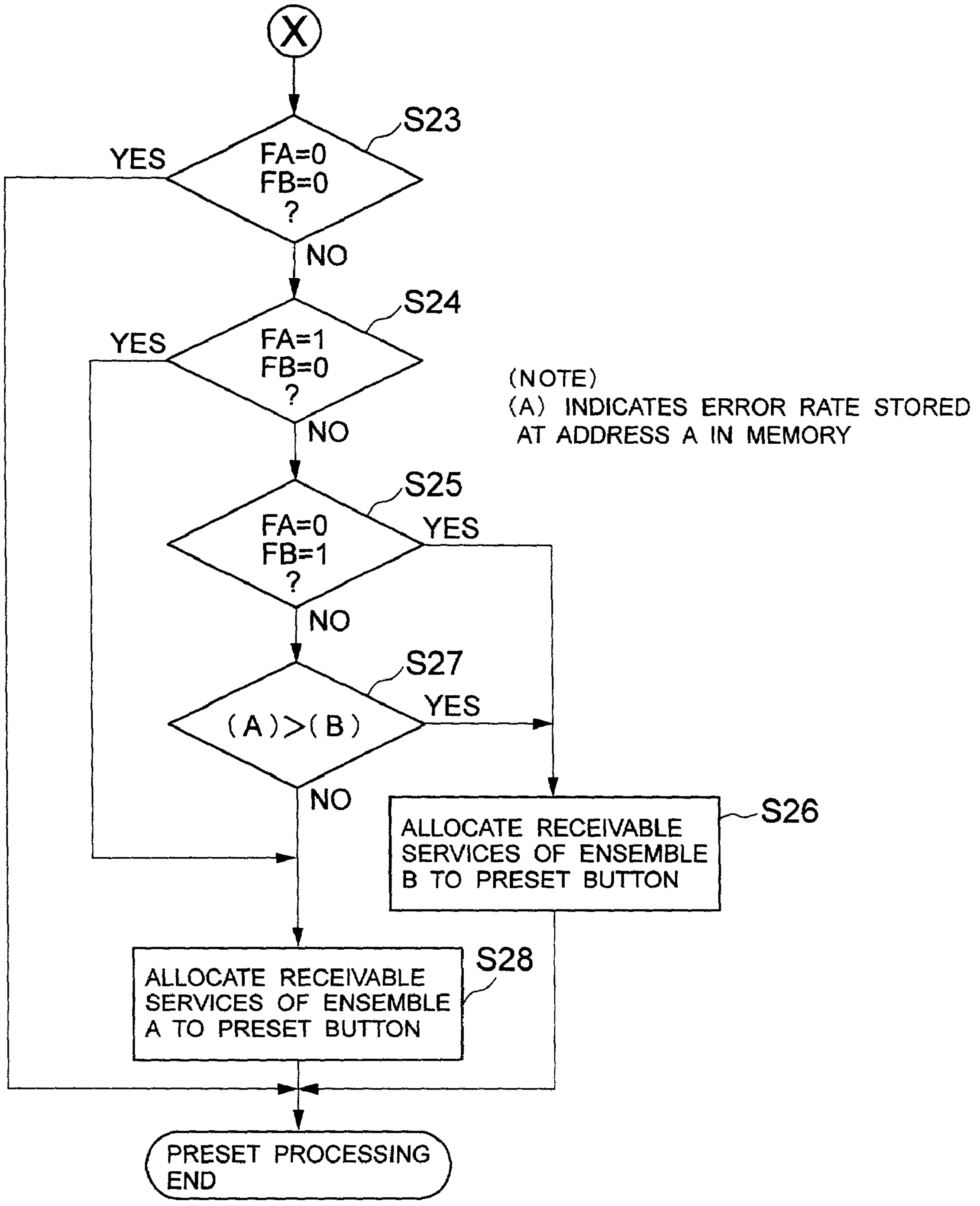
FIG. 3 is a flowchart of the next processing of the operation mode in FIG. 2.

In operation mode 1, the system controller 15 executes a subroutine for preset shown in the flowcharts in FIGS. 2 and 3. The system controller 15 executes the subroutine by interrupting the main routine which is executed in synchronization with a internal clock. The subroutine is started by, for example, an interruption signal generated when the user of the apparatus presses a preset button on the operating unit 18. The subroutine may be started by a timer at a predetermined time interval while the main routine is being executed. It is also possible to start the subroutine by combining these methods.

In the subroutine, the system controller 15 first determines whether or not all the receivable services are contained in the same ensemble (step 11).

In the present specifications, the term "receivable service" means, in the case of subscription broadcast, for example, only a service which is satisfactorily contracted with a broadcast enterprise. In the case of free broadcast, a "receivable service" means all the services contained in the broadcast. If the user sets a condition, for example, if the user desires to view and listen to traffic information service only or popular song service only, and so on, only the service which matches the condition becomes a "receivable service".

In step 11, when all the receivable services are contained in one ensemble A or B, the system controller 15 moves to step 12. Then the system controller 15 selects one receivable service from such ensemble. The received signal processing unit 12 measures the error rate of the reception of the service selected by the system controller 15. The error rate of the reception of the service is sent from the received signal processing unit 12 to the system controller 15 at a predetermined timing. There are various possible methods for selecting a receivable service from a conforming ensemble in order to measure its error rate. For example, one service may be fixedly provided for error rate measurement from among the receivable services in each ensemble. Another method is to set a service out of all of the receivable services in each ensemble for error rate measurement in a progressive manner, such as a round-robin system.

As described above, in a digital broadcast, a plurality of services contained in the same ensemble are received under the same reception conditions without exception. Therefore, in order to determine the reception conditions of all the services when there are ten services in one ensemble and all of them are receivable, it is sufficient to measure the error rate of only one service contained in the ensemble.

The system controller 15 determines whether or not the error rate measured in step 12 satisfies a predetermined reference value in the next step 13. When the measured value satisfies the predetermined reference value, the system controller 15 allocates a receivable service in the ensemble to a preset button of the receiving apparatus (step 14), and terminates preset. When the measured value does not satisfy the predetermined reference value, it is difficult to reproduce the reception information accurately, so the system controller 15 terminates the subroutine without performing preset.

When a receivable service is contained in both ensembles A and B in step 11, the system controller 15 performs the processing of steps 15 and 16. That is, the system controller 15 selects one service respectively out of the receivable services in each ensemble following the same procedure as in step 12. The received signal processing unit 12 measures the error rate of the reception of these services for each ensemble. The measured error rate value related to the service contained in ensemble A is stored at address (A) in the RAM of the memory 16. The measured value related to the service contained in ensemble B is stored at address (B) in the same RAM.

After that, the system controller 15 compares the measured value stored at address (A) in step 17 with said predetermined reference value of the error rate. When the measured error rate satisfies the reference value, the system controller 15 sets flag register FA in the RAM of the memory 16 to 1 (step 18). When the measured error rate does not satisfy the reference value, FA is reset to 0 (step 19). In the same manner, the system controller 15 compares the measured value of the error rate stored at address (B) with the predetermined reference value, and performs the set or reset processing of flag register FB (steps 20–22).

In the subroutine, the preset operation is selected based on the combination of the set state or the reset state of these two flag registers FA and FB, then executed.

First, the system controller 15 determines whether both of the two flag registers are reset, that is, whether FA=0 and FB=0 in step 23. When both FA and FB are 0, the error rate of the reception service in both ensembles A and B exceeds the predetermined reference value. In this case, the system controller 15 terminates processing in the subroutine without performing preset.

When both FA and FB are not 0 in step 23, the system controller 15 determines whether FA=1 and FB=0 in the next step 24. When these conditions are met, it means the error rate of the reception service in ensemble A satisfies the predetermined reference value and the error rate in ensemble B does not satisfy the predetermined reference value. Therefore, the system controller 15 moves to step 28 to perform processing for allocating the receivable service in ensemble A to a preset button.

When each flag register does not meet the above-mentioned conditions in step 24, the system controller 15 determines whether the state of each flag register is FA=0 and FB=1 (step 25). This state is a case in which the error rate of the reception service in ensemble A does not satisfy the predetermined reference value and the error rate in ensemble B satisfies the predetermined reference value. Therefore, the system controller 15 allocates the receivable service in ensemble B to a preset button (step 26).

If the contents of both flag registers FA and FB do not meet any of the conditions for decision processing in steps 23–25, the operation is performed as follows. That is, when both flag registers have been set to FA=1 and FB=1, the error rate of the receivable services contained in ensemble A and in ensemble B satisfies the predetermined reference value.

In this case, the system controller 15 compares the error rates of both ensembles in step 27. When the error rate for ensemble A is high (bad), the system controller 15 presets the service in ensemble B (step 26). The system controller 15 presets the service in ensemble A when the error rate in ensemble B is high(bad) (step 28).

When both flag registers have been set to 1, as described above, it means that the services contained in both ensemble A and ensemble B exhibit good reception conditions. Therefore, it is possible to design the system so that services belonging to one of the ensembles are preset in accordance with the procedure in step 26 or 28, then services belonging to the other ensemble are allocated to the remaining preset buttons, if there are any unused preset buttons.

For example, a preset standard error rate may be used as the predetermined reference value for the error rate in the above-mentioned steps 13, 17 and 20. The error rate of a service belonging to an ensemble received under good reception conditions out of a plurality of ensembles receivable by the receiving apparatus according to the present invention may be used as a predetermined reference value.

As described above, the receiving apparatus according to the present invention retrieves the reception conditions of all the receivable services by using a feature of the digital broadcast so that all the services contained in the same ensemble can be surely received under the same reception conditions. Therefore, even if the number of the receivable services increases in the same ensemble, the reception conditions can be retrieved during the time required for the reception of one service, so it is possible to achieve quick preset.

Figure 4:
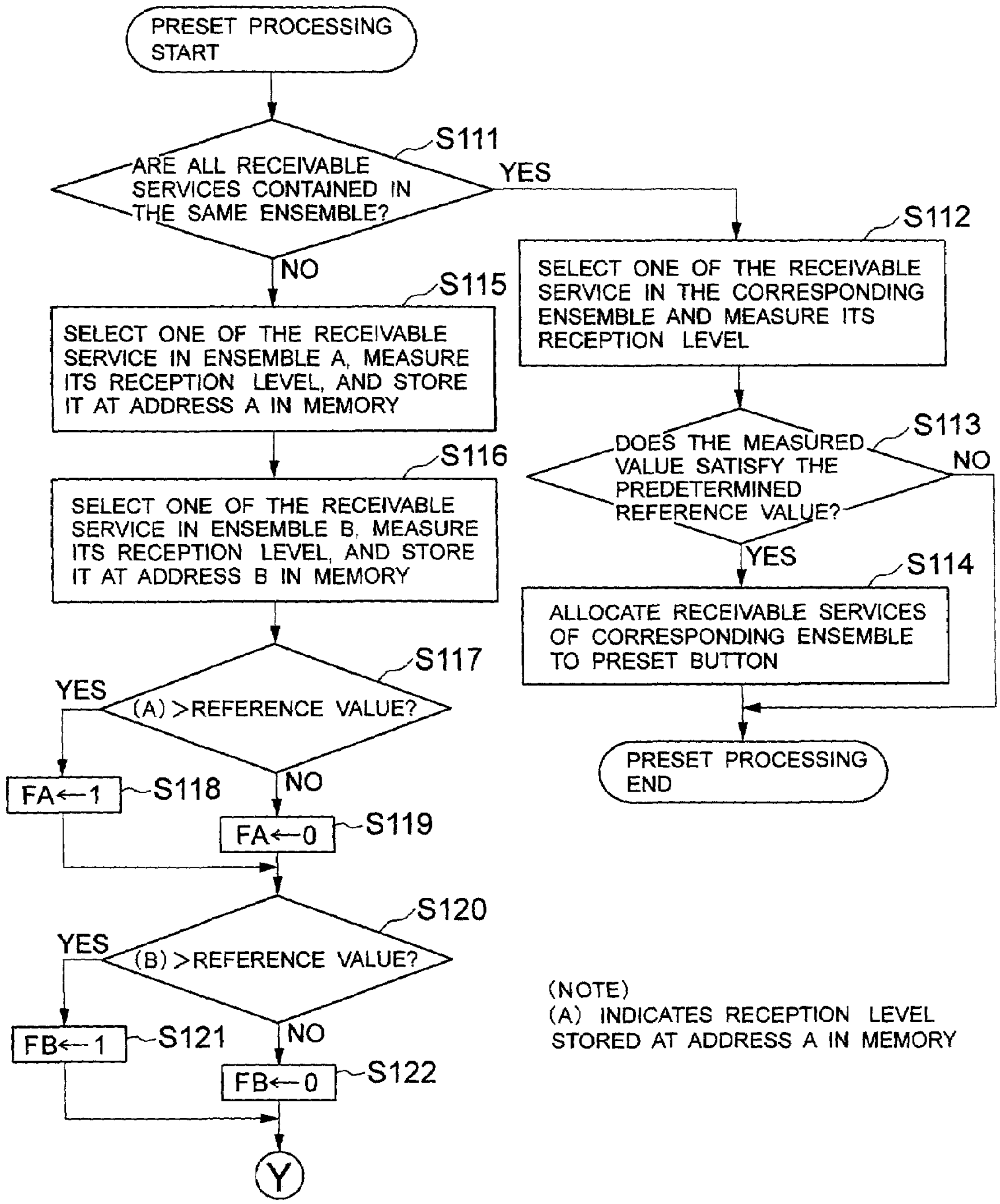
FIG. 4 is a flowchart of the processing in operation mode 2 of the apparatus in FIG. 1.
Figure 5:
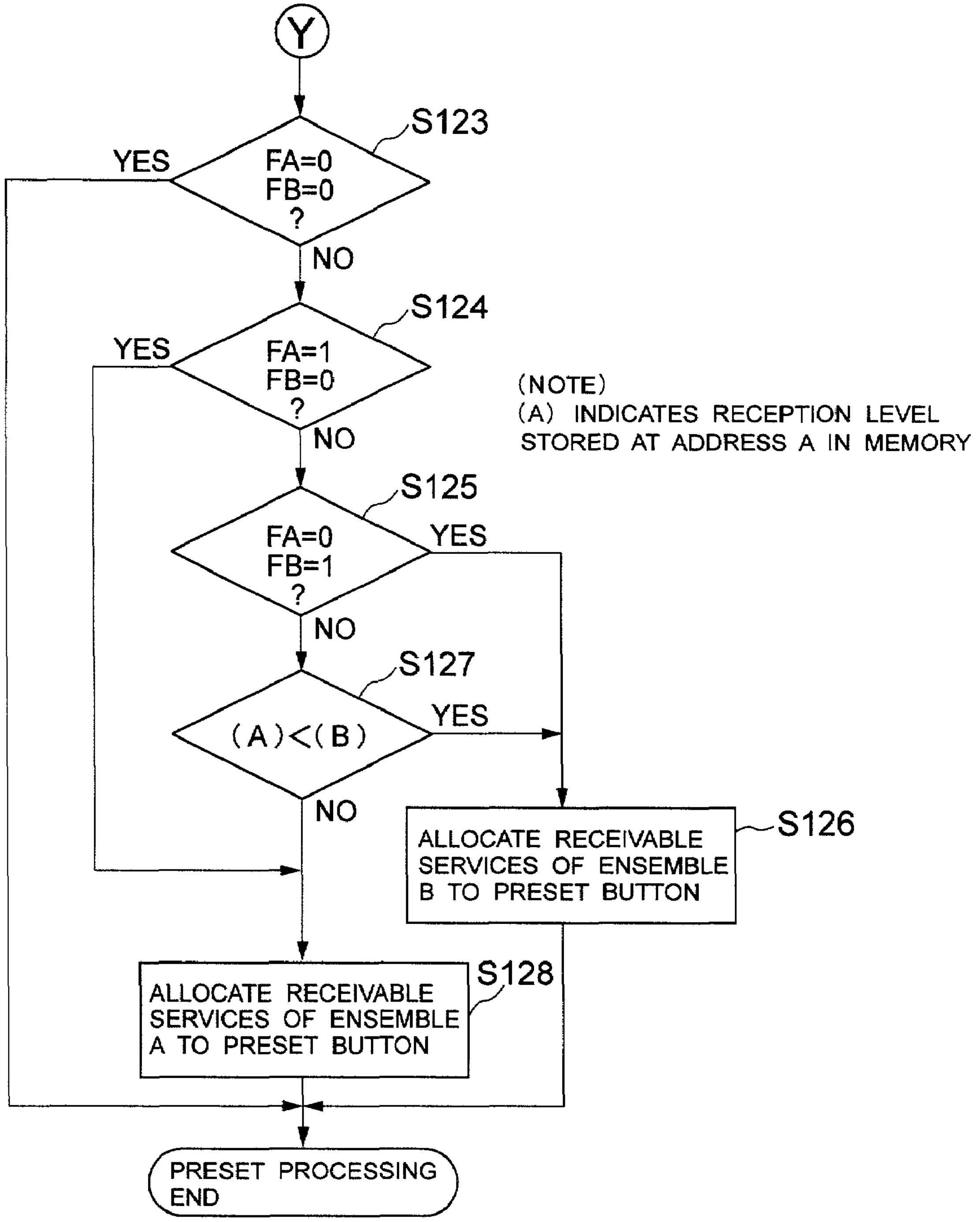
FIG. 5 is a flowchart of the next processing of the operation mode in FIG. 4.

The operation preset mode 2 of the present apparatus is described below. Operation mode 2 means an operation for performing preset based on the reception level of a receivable service. FIGS. 4 and 5 are flowcharts of a subroutine for such processing.

In operation mode 2, the starting procedure for such subroutine is the same as that for operation mode 1. That is, this subroutine can be started by pressing an autopreset button on the operating unit 18 or by a timer interruption command in the main routine.

In operation mode 1, preset is performed based on an error rate during the reception of a service. In operation mode 2, preset is performed based on the reception level during the reception of a service. That is, if "error rate" is replaced by "reception level" in the description of operation mode 1, such description is the same description as for operation mode 2. Therefore, the detailed description of operation mode 2 is omitted here, and its outline will be described briefly below.

That is, as shown in the flowcharts in FIGS. 4 and 5, the system controller 15 determines whether or not all receivable services are contained in the same ensemble. If all the receivable services are contained same ensemble, and the ensamble's reception level is above a predetermined reception level, the system controller 15 performs preset processing for such services.

When such services are contained in both ensemble A and ensemble B, the reception level of such services in each ensemble is measured. Based on the measured reception level, preset processing is performed for the service in either ensemble A or ensemble B.

The lower the error rate means the better the reception condition. In contrast, the higher the reception level means the better the reception condition. Therefore, the results of the decision-making process in steps 117, 120, and 127 are opposite to those in steps 17, 20 and 27 corresponding to the same process in operation mode 1.

The digital broadcast has such features as described above, so it is ensured that a plurality of services contained in the same ensemble are received under the same reception conditions. Therefore, to check the reception level of each service contained in one ensemble, it is sufficient to measure the reception level of only one service in each ensemble. That is, in operation mode 2 where preset is performed based on the reception level, like in operation mode 1, the reception condition of a receivable service can also be retrieved in a very short time.

The reception level of a service contained in each ensemble is sent from the received signal level detecting circuit 14 to the system controller 15 at a predetermined timing. In the present embodiment, operation modes 1 and 2 can be changed over via the keyboard of the operating unit 18 or through a ROM table in which the attribute of the operation mode is preset in the memory 16.

The present invention is not limited to the digital broadcast described in the embodiment. For example, the present invention is also applicable to any digital broadcast containing a plurality of services in one ensemble such as DBA (Digital Audio Broadcasting).

In the embodiment, preset processing is performed. However, instead of preset processing, search processing, which retrieves a service(program) receivable under good reception conditions, and starts the reception of such service (program), can also be used.

As described above, the digital receiving apparatus according to the present invention can search and preset a receivable service in a very short time, when it receives a digital broadcast comprising a plurality of ensembles, each containing many services.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application No.2000-209744 which is hereby incorporated by reference.

What is claimed is:

1. In a receiver for receiving digital broadcasts of a plurality of ensembles each including a plurality of services, a digital broadcast receiving apparatus which performs at least one of a search operation and a preset operation for a receivable service, comprising:

an error rate detecting part for detecting an error rate at its reception of each of said services; and an error rate comparing part for comparing the detected error rates for services with each other;

wherein at least one of said search operation and said preset operation is performed, based on the comparison result by said error rate comparing part, while a higher priority for the operation being assigned to one or more services belonging to an ensemble containing a service with a lower error rate, than one or more services belonging to an ensemble containing a service with a higher error rate.

2. A digital broadcast receiving apparatus according to claim 1, wherein said error rate detecting part detects an error rate of at least one of said services contained in each ensemble.

3. In a receiver for receiving digital broadcasts of a plurality of ensembles each including a plurality of services, a digital broadcast receiving apparatus which performs at least one of a search operation and a preset operation for a receivable service, comprising:

a reception level detecting part for detecting a reception level at its reception of each of said services; and a reception level comparing part for comparing the detected reception levels for services with each other;

wherein at least one of said search operation and said preset operation is performed, based on the comparison result by said reception level comparing part, while a higher priority for the operation being assigned to one or more services belonging to an ensemble containing a service with a higher reception level, than one or more services belonging to an ensemble containing a service with a lower reception level.

4. A digital broadcast receiving apparatus according to claim 3, wherein said reception level detecting part detects a reception level of at least one of said services contained in each of said ensembles.

* * * * *